(12) United States Patent
Lee et al.

(10) Patent No.: US 8,148,724 B2
(45) Date of Patent: Apr. 3, 2012

(54) LIQUID CRYSTAL DISPLAY DEVICE AND METHOD OF MANUFACTURING THE SAME

(75) Inventors: Chang-Deok Lee, Cheongju-si (KR); Hyung-Beom Shin, Daegu (KR); Seok Kim, Pohang-si (KR)

(73) Assignee: LG Display Co., Ltd., Seoul (KR)

( * ) Notice: Subject to any disclaimer, the term of this patent is extended or adjusted under 35 U.S.C. 154(b) by 164 days.

(21) Appl. No.: 12/472,098

(22) Filed: May 26, 2009

(65) Prior Publication Data

US 2010/0127263 A1    May 27, 2010

(30) Foreign Application Priority Data

Nov. 26, 2008  (KR) .................. 10-2008-0118306

(51) Int. Cl.
*H01L 29/04* (2006.01)
*H01L 29/10* (2006.01)
*H01L 21/84* (2006.01)

(52) U.S. Cl. .................. 257/59; 257/E29.137; 438/149; 438/158; 439/139

(58) Field of Classification Search .................. 257/59, 257/E33.004, E21.412, E29.137; 438/30, 438/149, 158; 439/139
See application file for complete search history.

(56) References Cited

U.S. PATENT DOCUMENTS

| 6,190,934 B1* | 2/2001 | Kang et al. ...................... 438/30 |
| 7,402,470 B2* | 7/2008 | Lee et al. ...................... 438/158 |
| 2004/0155992 A1* | 8/2004 | Choi .............................. 349/43 |
| 2004/0257509 A1* | 12/2004 | Lee et al. ...................... 349/139 |
| 2009/0103037 A1* | 4/2009 | Abe et al. ...................... 349/150 |

FOREIGN PATENT DOCUMENTS

| KR | 10-2004-0059066 A | 7/2004 |
| KR | 10-2005-0069102 B1 | 7/2005 |

* cited by examiner

*Primary Examiner* — Zandra Smith
*Assistant Examiner* — Jeremy Joy
(74) *Attorney, Agent, or Firm* — Birch, Stewart, Kolasch & Birch, LLP

(57) ABSTRACT

A liquid crystal display device includes a gate line and a data line on a substrate crossing each other to define a pixel region; a thin film transistor in the pixel region and connected to the gate line and the data line; a pixel electrode in the pixel region and connected to the thin film transistor; and a gate pad at an end of the gate line and a data pad at an end of the data line, at least one of the gate pad and the data pad including: a pad electrode including at least one pad contact hole therein along with a passivation layer, the passivation layer on the pad electrode, at least one side of the pad contact hole having an uneven shape in plane; and a pad electrode terminal contacting inner side surfaces of the pad electrode surrounding the pad contact hole.

8 Claims, 10 Drawing Sheets

LIQUID CRYSTAL DISPLAY DEVICE AND METHOD OF MANUFACTURING THE SAME

The present invention claims the benefit of Korean Patent Application No. 10-2008-0118306, filed in Korea on Nov. 26, 2008, which is hereby incorporated by reference for all purposes as if fully set forth herein.

BACKGROUND OF THE INVENTION

1. Field of the Invention

The present invention relates to a liquid crystal display device, and more particularly, to a liquid crystal display (LCD) device and a method of manufacturing the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

FIG. 1 is a cross-sectional view illustrating an array substrate for an LCD device according to the related art.

FIG. 1 shows the array substrate manufactured through four mask processes. Referring to FIG. 1, the array substrate includes a thin film transistor in a switching region TrA and a data pad in a data pad region DPA on a substrate 10.

The thin film transistor includes a gate electrode 21, a first semiconductor layer 25 and source and drain electrodes 27 and 29. The first semiconductor layer 25 includes an active layer 25a made of intrinsic amorphous silicon and an ohmic contact layer 25b made of impurity-doped amorphous silicon.

A gate insulating layer 23 is on the gate electrode 21. A passivation layer 31 is on the source and drain electrodes 27 and 29 and has a drain contact hole 35 exposing the drain electrode 29. A pixel electrode 33 is connected to the drain electrode 29 through the drain contact hole 35.

In the data pad region DPA, a data pad electrode 41 and a data pad electrode terminal 45 are formed. The data pad electrode 41 is on a second semiconductor layer 26. The second semiconductor layer 26 includes a first pattern 26a made of intrinsic amorphous silicon and a second pattern 26b made of impurity-doped amorphous silicon. The data pad electrode terminal 45 is connected to the data pad electrode 41 through a data pad contact hole 43 of the passivation layer 31.

The data pad electrode 41 is made of molybdenum (Mo) having a low resistance. When the passivation layer 31 is patterned, the data pad electrode 41 of the molybdenum is etched and includes the data pad contact hole 43 therein together with the passivation layer 31. Accordingly, the data pad contact hole 43 exposes a top surface of the second pattern 26b and further exposes inner side surfaces of the data pad electrode 41 surrounding the data pad contact hole 43. This type of contact may be referred to as a side contact.

The data pad contact hole 43 has a rectangular shape in plane. Accordingly, when the data pad electrode terminal 45 has the side contact with the data pad electrode 41, a contact area therebetween is small, and a contact resistance increases. The increase of the contact resistance causes delay of a data signal, and display quality is thus degraded.

SUMMARY OF THE INVENTION

Accordingly, the present invention is directed to a liquid crystal display device and method of manufacturing the same that substantially obviates one or more of the problems due to limitations and disadvantages of the related art.

An advantage of the present invention is to provide a liquid crystal display device and method of manufacturing the same that can improve display quality.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a liquid crystal display device includes a gate line and a data line on a substrate crossing each other to define a pixel region; a thin film transistor in the pixel region and connected to the gate line and the data line; a pixel electrode in the pixel region and connected to the thin film transistor; and a gate pad at an end of the gate line and a data pad at an end of the data line, at least one of the gate pad and the data pad including: a pad electrode including at least one pad contact hole therein along with a passivation layer, the passivation layer on the pad electrode, at least one side of the pad contact hole having an uneven shape in plane; and a pad electrode terminal contacting inner side surfaces of the pad electrode surrounding the pad contact hole.

In another aspect, a method of manufacturing a liquid crystal display device includes forming a gate line and a data line on a substrate crossing each other to define a pixel region; forming a thin film transistor in the pixel region and connected to the gate line and the data line; forming a pixel electrode in the pixel region and connected to the thin film transistor; and forming a gate pad at an end of the gate line and a data pad at an end of the data line, forming at least one of the gate pad and the data pad including: forming a pad electrode including at least one pad contact hole therein along with a passivation layer, the passivation layer on the pad electrode, at least one side of the pad contact hole having an uneven shape in plane; and forming a pad electrode terminal contacting inner side surfaces of the pad electrode surrounding the pad contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 1:
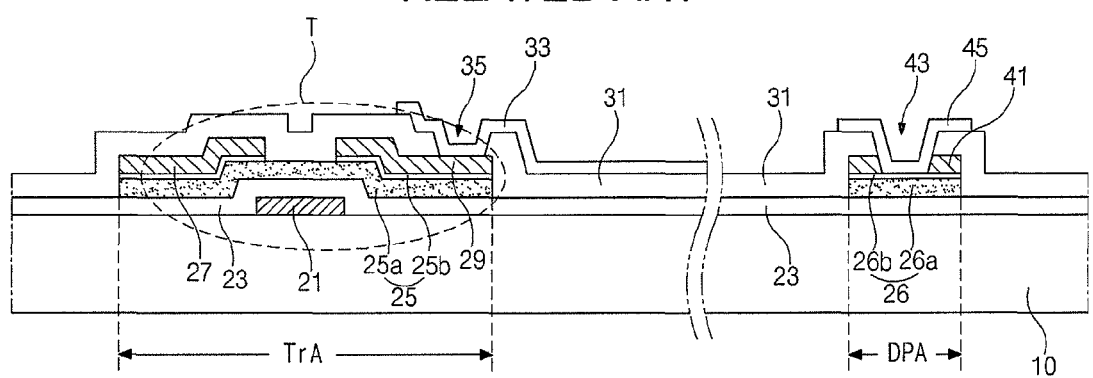
FIG. 1 is a cross-sectional view illustrating an array substrate for an LCD device according to the related art.
Figure 2:
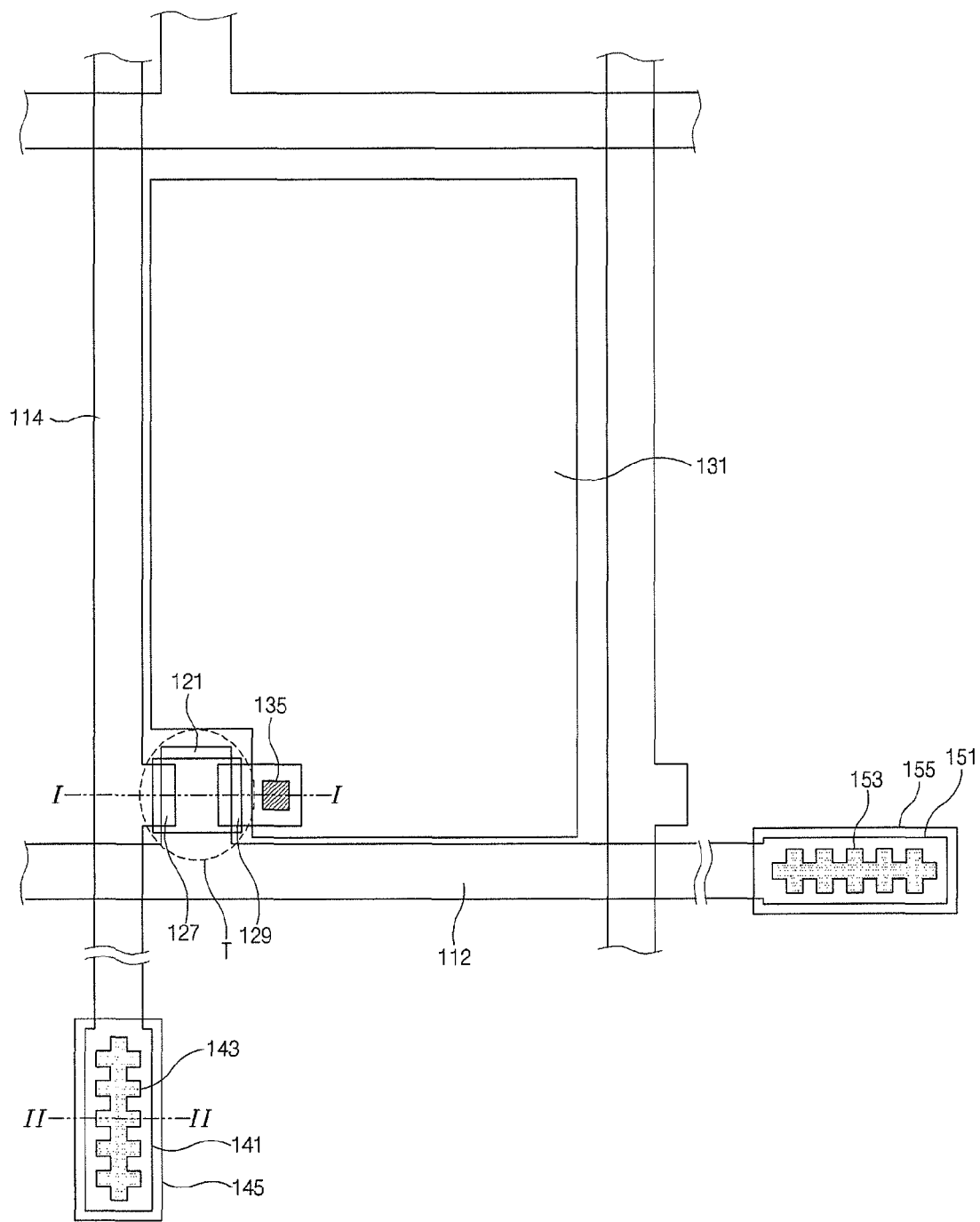
FIG. 2 is a plan view illustrating an array substrate of an LCD device according to an embodiment of the present invention.

FIG. 2 is a plan view illustrating an array substrate of an LCD device according to an embodiment of the present invention.

Referring to FIG. 2, the array substrate includes a gate line 112 and a data line 114 crossing each other to define a pixel region on a substrate.

A thin film transistor is in the pixel region and connected to the corresponding gate and data lines 112 and 114. The thin film transistor T includes a gate electrode 121, a first semiconductor layer, and source and drain electrodes 127 and 129. The gate electrode 121 is connected to the gate line 112, and the source electrode 127 is connected to the data line 114.

A pixel electrode 131 is in the pixel region P and connected to the drain electrode 129 of the thin film transistor through a drain contact hole 135.

A gate pad electrode 151 is at one end of the gate line 112. A gate pad electrode terminal 155 is connected to the gate pad electrode 151 through a gate pad contact hole 153. The gate pad electrode terminal 155 is supplied with a gate signal from a driving circuit.

A data pad electrode 141 is at one end of the data line 114. A data pad electrode terminal 145 is connected to the data pad electrode 141 through a data pad contact hole 143. The data pad electrode terminal 145 is supplied with a data signal from the driving circuit.

The data pad electrode 141 may have the data pad contact hole 143 surrounded by inner surfaces of the data pad electrode 141. At least one side of the data pad contact hole 143 may have an uneven shape in plane, and at least one of the inner side surfaces of the data pad electrode 141 may have an uneven shape in plane. Because of the uneven shape, a side contact area between the data pad electrode 141 and the data pad electrode terminal 145 increases compared to that of the related art, and a contact resistance is reduced. Accordingly, a data signal delay can be reduced.

The gate pad electrode 151 may have the gate pad contact hole 153 surrounded by inner surfaces of the gate pad electrode 151. At least one side of the gate pad contact hole 153 may have an uneven shape in plane, and at least one of the inner side surfaces of the gate pad electrode 151 may have an uneven shape in plane. Because of the uneven shape, a side contact area between the gate pad electrode 151 and the gate pad electrode terminal 155 also increases, and a contact resistance is reduced. Accordingly, a gate signal delay can be reduced.

FIGS. 3A to 3E are cross-sectional views, taken along lines I-I and II-II, illustrating a method of manufacturing the array substrate of the LCD device according to the embodiment of the present invention.

Figure 3A:
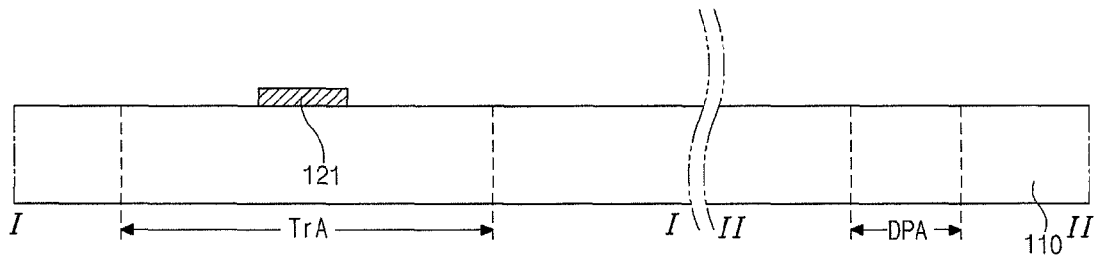
FIGS. 3A to 3E are cross-sectional views, taken along lines I-I and II-II, illustrating a method of manufacturing the array substrate of the LCD device according to the embodiment of the present invention.

Referring to FIG. 3A, a first conductive material is deposited on a substrate 110 and patterned in a first mask process to form a gate electrode 121, a gate line (112 of FIG. 2), and a gate pad electrode (151 of FIG. 2). The substrate includes a switching region TrA and a data pad region DPA. The first mask process may include a process of depositing a photoresist layer on the conductive material, a light exposure process, a developing process and a stripping process. The first conductive material may be one of aluminum (Al), aluminum alloy, molybdenum (Mo) and chromium (Cr). Alternatively, when the first conductive material is aluminum (Al) or aluminum alloy, another conductive material of molybdenum (Mo) may be deposited on the first conductive material, and thus the gate electrode 121, the gate line and the gate pad electrode may have a double-layered structure.

Figure 3B:
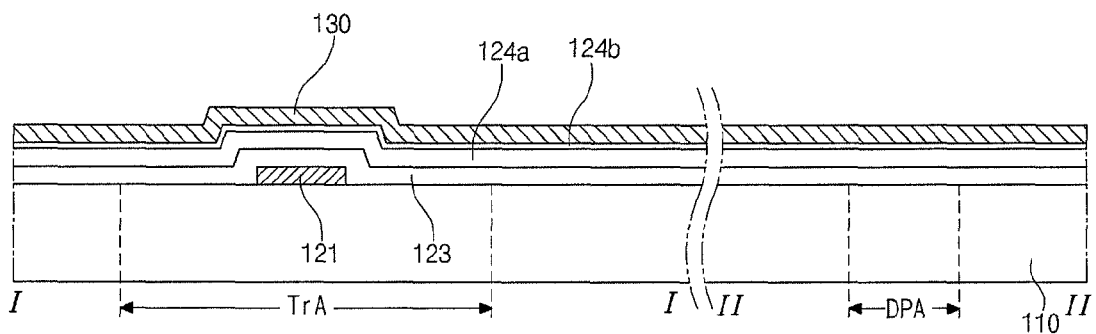

Referring to FIG. 3B, a gate insulating layer 123 is formed on the substrate 100 having the gate electrode 121. The gate insulating layer 123 may be made of an inorganic insulating material. The inorganic insulating material may be one of silicon oxide ($SiO_2$) and silicon nitride (SiNx).

An intrinsic amorphous silicon layer 124a and an impurity-doped amorphous silicon layer 124b are formed on the gate insulating layer 123. A second conductive material layer 130 is formed on the impurity-doped amorphous silicon layer 124b. The second conductive material may be one of chromium (Cr), aluminum alloy, molybdenum (Mo), titanium (Ti), copper (Cu) and copper alloy. As size and resolution of the LCD device increase, a width of signal lines is reduced, and a resistance of the signal lines increases. Accordingly, to reduce the resistance of the signal lines, molybdenum (Mo) having a low resistance is preferred.

Figure 3C:
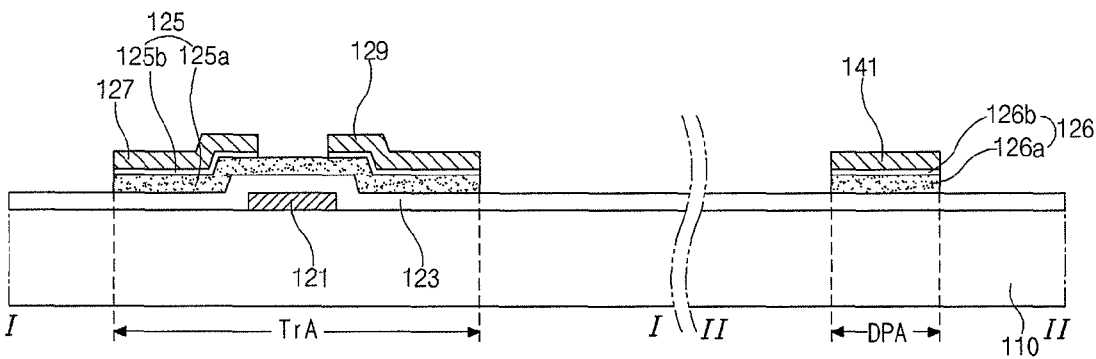

Referring to FIG. 3C, the second conductive material layer (130 of FIG. 3B), the impurity-doped amorphous silicon layer (124b of FIG. 3B) and the intrinsic amorphous silicon layer (124a of FIG. 3B) are patterned in a second mask process to form source and drain electrodes 127 and 129, a data line (114 of FIG. 2), a data pad electrode 141, a first semiconductor layer 125 and a second semiconductor layer 126.

The first semiconductor layer 125 includes an active layer 125a of intrinsic amorphous silicon and an ohmic contact layer 125b of impurity-doped amorphous silicon. The second semiconductor layer 126 includes a first pattern 126a of intrinsic amorphous silicon and a second pattern 126b of impurity-doped amorphous silicon.

The first semiconductor layer 125 is below the source and drain electrodes 127 and 129. The second semiconductor layer 126 is below and along the data line and the data pad electrode 141. The first semiconductor layer 125 extends from the second semiconductor layer 126.

Figure 3D:
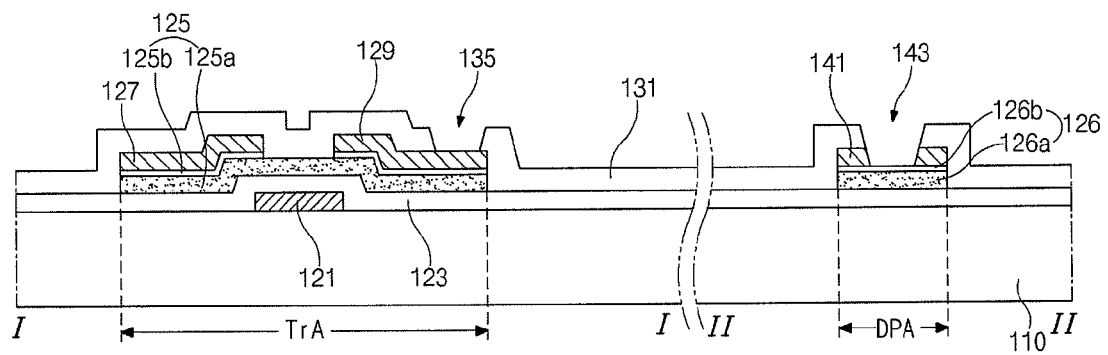

Referring to FIG. 3D, a passivation layer 131 is formed on the substrate 110 having the source and drain electrodes 127 and 129. The passivation layer 131 is patterned in a third mask process to form a drain contact hole 135 and a data pad contact hole 143. The drain contact hole 135 exposes the drain electrode 129. When the data pad contact hole 143 is formed, the data pad electrode 141 is also removed. Accordingly, the data pad electrode 141 has the data pad contact hole 143 therein, and the second semiconductor layer 126 is exposed through the data pad contact hole 143. Inner side surfaces of the data pad electrode 141 surround the data pad contact hole 143.

In the third mask process, portions of the passivation layer 131 and the gate insulating layer 143 over the gate pad electrode is also removed to form a gate pad contact hole (153 of FIG. 2). Further, when the gate pad contact hole is formed, the gate pad electrode may be also removed. Accordingly, the data pad electrode may have the gate pad contact hole therein. Inner side surfaces of the gate pad electrode surround the gate pad contact hole.

Figure 3E:
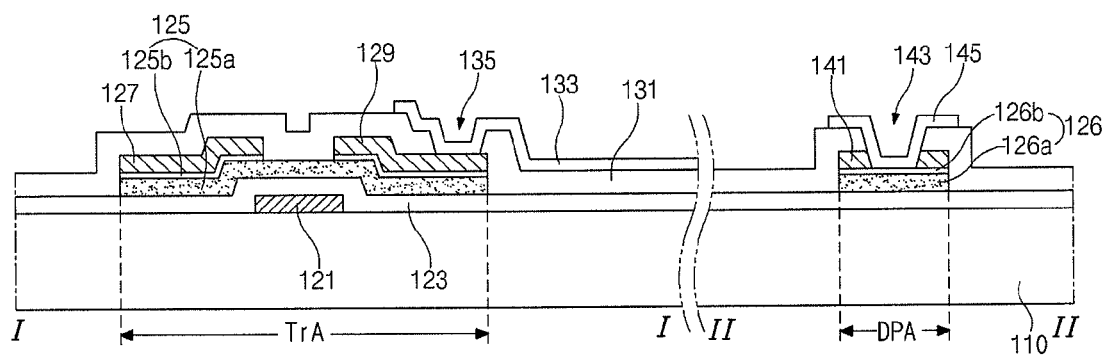

Referring to FIG. 3E, a transparent conductive material is deposited on the passivation layer 131 and patterned in a fourth mask process to form a pixel electrode 133, a data pad electrode terminal 145 and a gate pad electrode terminal (155 of FIG. 2).

The pixel electrode 133 contacts the drain electrode 129 through the drain contact hole 135. The data pad electrode terminal 145 contacts the inner side surfaces of the data pad electrode 141 through the data pad contact hole 143. The gate pad electrode contacts the gate pad electrode terminal through the gate pad contact hole. Alternatively, when the gate pad electrode includes the gate pad contact hole therein, the gate pad electrode may contact the inner side surfaces of the gate pad electrode terminal.

Through the above-described processes, the array substrate can be manufactured. Alternatively, the array substrate may be manufactured through other numbered mask processes, or through other various processes. Further, the LCD device can be manufactured by manufacturing an opposing substrate and attaching the array substrate and the opposing substrate.

As described above, the data pad electrode terminal 145 contacts the inner side surfaces of the data pad electrode 141. Since the data pad electrode terminal 145 has a side contact with the data pad electrode 141, in order to reduce a signal delay, reducing a side contact resistance between the data pad electrode terminal 145 and the data pad electrode 141 is required. To do this, in the embodiment, a total area of the inner side surfaces of the data pad electrode 141 increases. In order to increase the total area of the inner side surfaces of the data pad electrode 141, the inner side surface at least one inner side of the data pad electrode 141 has an uneven shape in plane. In other words, at least one side of the data pad contact hole 143 has an uneven shape in plane.

Figure 4:
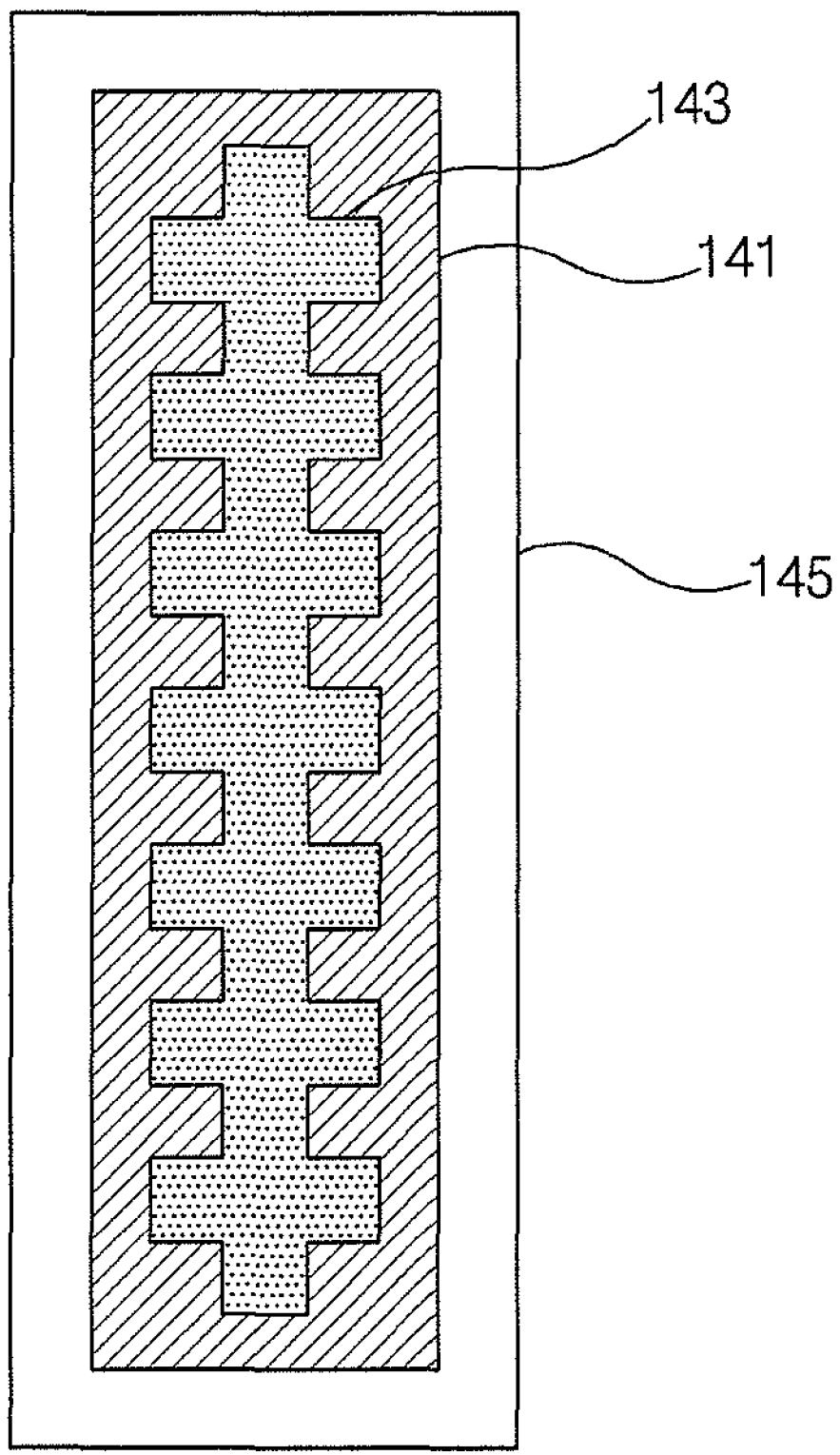
FIGS. 4, 5A-5D, and 6A-6C are plan views illustrating examples of a data pad of the LCD device according to the embodiment of the present invention.
Figure 6A:
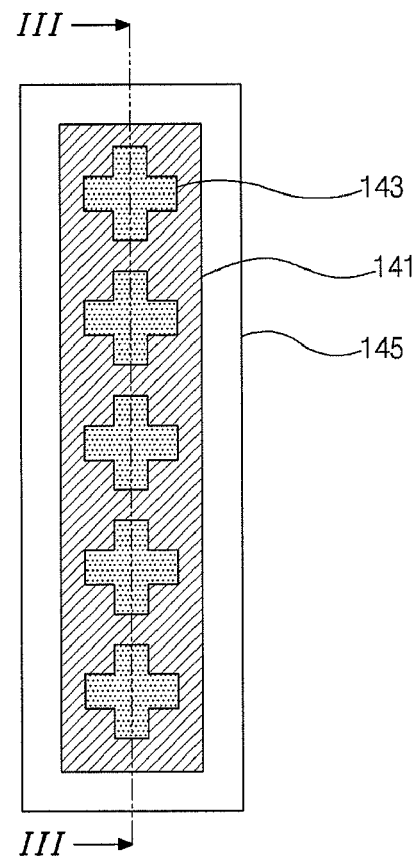
Figure 6B:
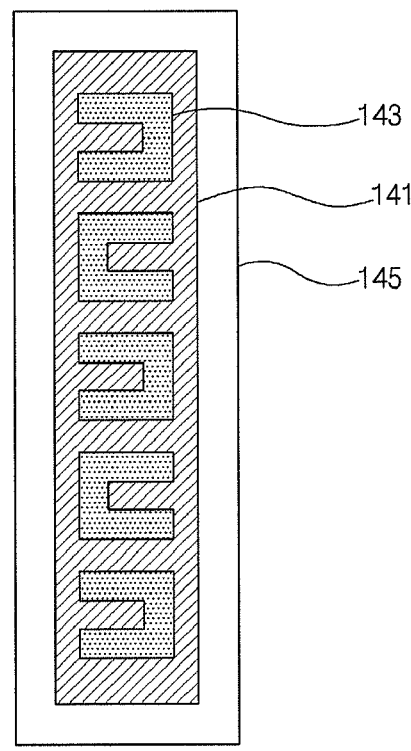
Figure 6C:
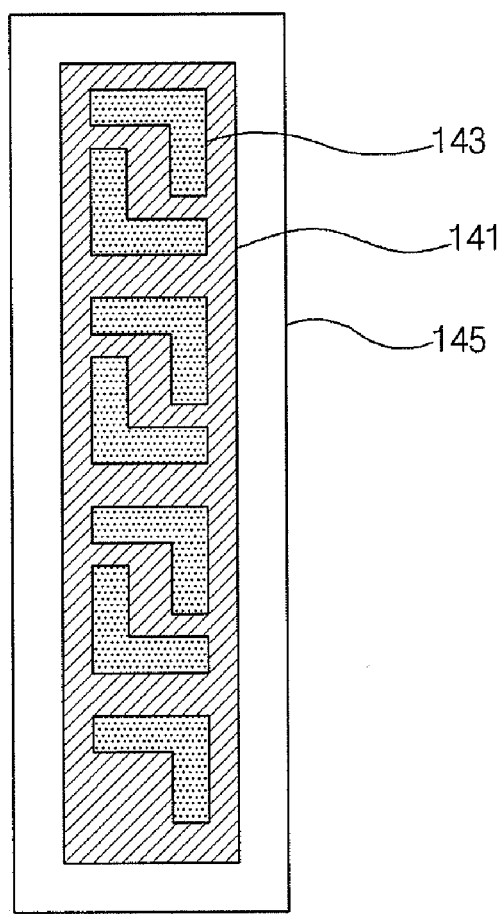

FIGS. 4 and 6C are plan views illustrating examples of a data pad of the LCD device according to the embodiment of the present invention.

Referring to FIG. 4, opposing side surfaces of a data pad contact hole 143 may have an uneven surface and are symmetrical to each other. Since the data pad electrode 141 has the data pad contact hole 143, and opposing inner side surfaces of the data pad electrode 141 may have an uneven surface and symmetrical to each other. For example, the right and left inner side surfaces of the data pad electrode 141 have an uneven shape and symmetrical to each other with respect to a length direction of the data pad.

Since at least one inner side surface has the uneven shape, the inner side surfaces has a total area more than the inner side surfaces of the related art data pad electrode each of which has a straight shape.

A relationship between a contact resistance and a contact area is expressed with a first formula, $Rc \propto 1/Ar$ (where Rc is a contact resistance, and Ar is a contact area).

Referring to the first formula, the contact resistance Rc is inversely proportional to the contact area Ar. Accordingly, as the contact area Ar is greater, the contact resistance Rc is less.

Since the data pad electrode 141 has a side contact with the data pad electrode terminal 145, the total area of the inner side surfaces of the data pad electrode 141 is the contact area Ar.

The contact area is expressed with a second formula, $Ar=T*H$ (where T is a thickness of the data pad electrode 141, and H is a circumference of the inner side surfaces of the data pad electrode 141 i.e., or a circumference of the data pad contact hole 143).

The data pad electrode 141 has substantially the same thickness T all over the data pad electrode 141. Accordingly, in order to increase the contact area Ar, it is preferred that the circumference H increases. To do this, the at least one inner side surface of the data pad electrode 141 of the embodiment has an uneven shape. In other words, as the inner side surface of the data pad electrode 141 has an uneven surface, the circumference H increases.

For example, the right inner side surface of the data pad electrode 141 includes first to third surfaces. The first surface and the third surface extend along the length direction of the data pad, and the first surface is inside relatively to the third surface. The second surface extends along a width direction crossing the length direction and connects the first and third surfaces at both ends of the second surface. Compared to a right inner surface of a data pad electrode having a straight shape, the uneven right inner surface has an area n*A2 more than the straight right inner surface (where n is a number of the second surfaces in the right inner side surface, and A2 is an area of the second surface). Accordingly, since the data pad electrode 141 of the embodiment has at least one uneven inner side surface, the contact area Ar increases, and thus the contact resistance Rc is reduced.

Figure 5A:
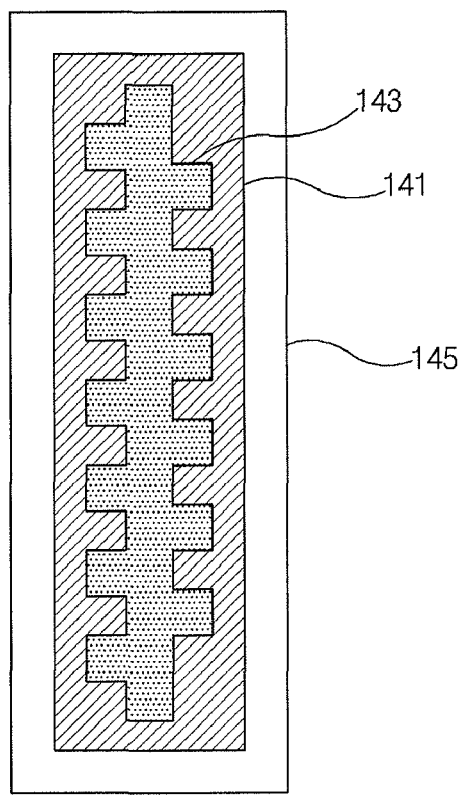
Figure 5B:
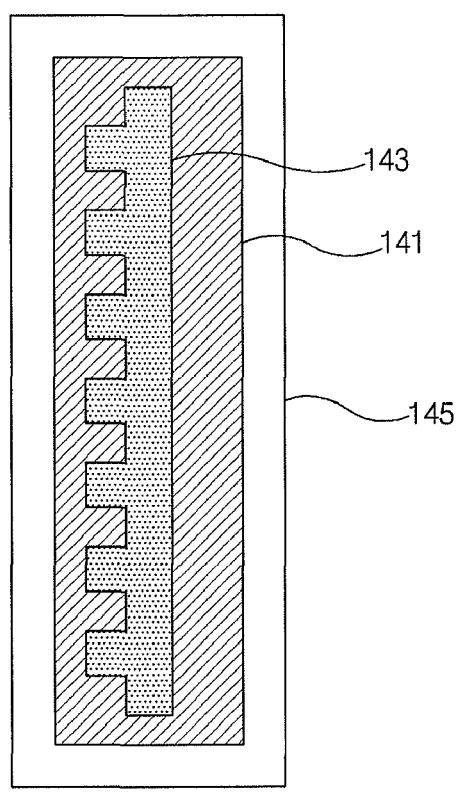
Figure 5C:
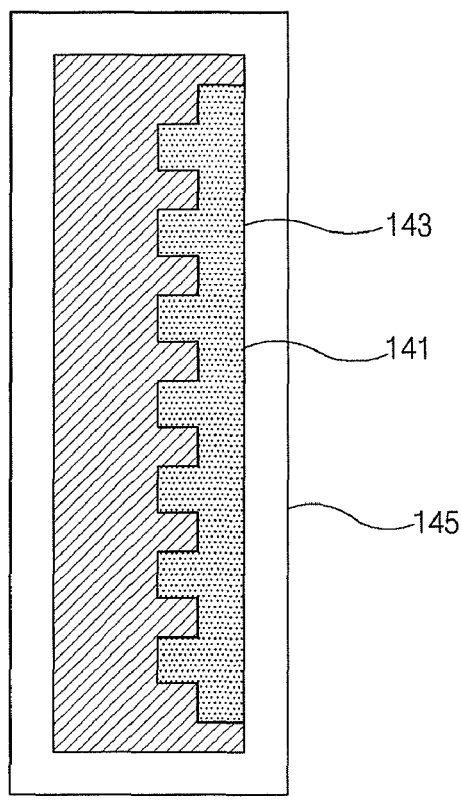

FIGS. 5A to 5C each show data pad contact holes having shapes different from the shape of the data pad contact hole of FIG. 4.

Referring to FIG. 5A, the opposing sides of the data pad contact hole 143 may have an uneven shape. However, the opposing surfaces of the data pad contact hole 143 may be asymmetrical to each other.

Referring to FIG. 5B, one of the opposing sides of the data pad contact hole 143 may have an uneven shape. Referring to FIG. 5C, one of the opposing sides of the data pad contact hole 143 may have an uneven shape, and the other one of the opposing sides of the data pad contact hole 143 is located at the corresponding side of the data pad electrode 141.

Figure 5D:
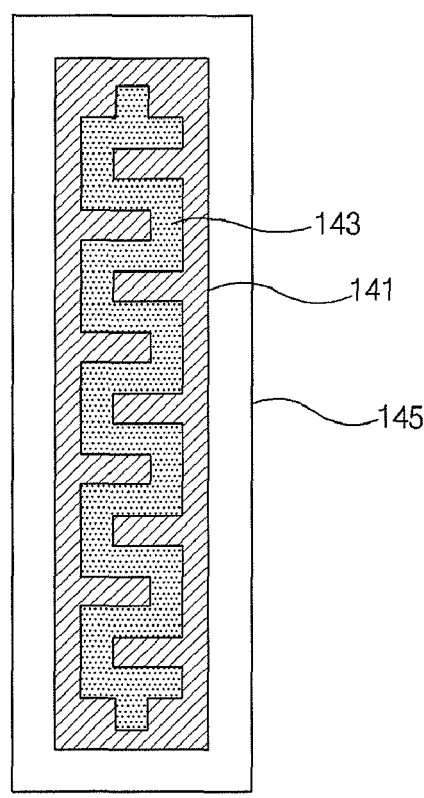

Referring to FIG. 5D, the opposing sides of the data pad contact hole 143 may have an uneven shape, and more particularly, have the similarly-bent shape. For example, the data pad contact hole 143 may have a multiple-bent-path shape.

FIGS. 6A to 6C show data pads including at least two data pad contact holes.

Referring to FIG. 6A, the data pad electrode 141 and the passivation layer (131 of FIG. 7) may have at least two data pad contact holes 143 along the length direction of the data pad. Opposing one sides of each data pad contact hole 143 may have an uneven shape. For example, each data pad contact hole 143 may have a cross shape.

Referring to FIG. 6B, the data pad electrode 141 and the passivation layer may have at least two data pad contact holes 143 along the length direction of the data pad. One of the opposing sides of each data pad contact hole 143 may have an uneven shape. For example, each data pad contact hole 143 may have a "⊐"-shape. The data pad contact holes 143 may be arranged along the length direction such that open portions of the "⊐"-shapes in an opposite direction alternate. For example, the open portion of the "⊐"-shape of a first data pad contact hole 143 faces right while the open portion of the "⊐"-shape of a second data pad contact hole 143 faces left.

Referring to FIG. 6C, the data pad electrode 141 and the passivation layer may have at least two data pad contact holes 143 along the length direction of the data pad. One of the opposing sides of each data pad contact hole 143 may have an uneven shape. For example, each data pad contact hole 143 may have an "L"-shape. The data pad contact holes 143 may be arranged along the length direction such that the "L"-shapes in an upside-down and rightside-left direction alternate. For example, the "L"-shape of a second data pad contact hole 143 is upside down and rightside left with respect to the "L"-shape of a first data pad contact hole 143.

A contact area between the data pad electrode 141 and the data pad electrode terminal 143 in FIGS. 6A to 6C is expressed with a third formula, Ar=T*H*N (where T is a thickness of the data pad electrode 141, H is a circumference of each data pad contact hole 143, and N is a number of the data pad contact holes 143).

Figure 7:
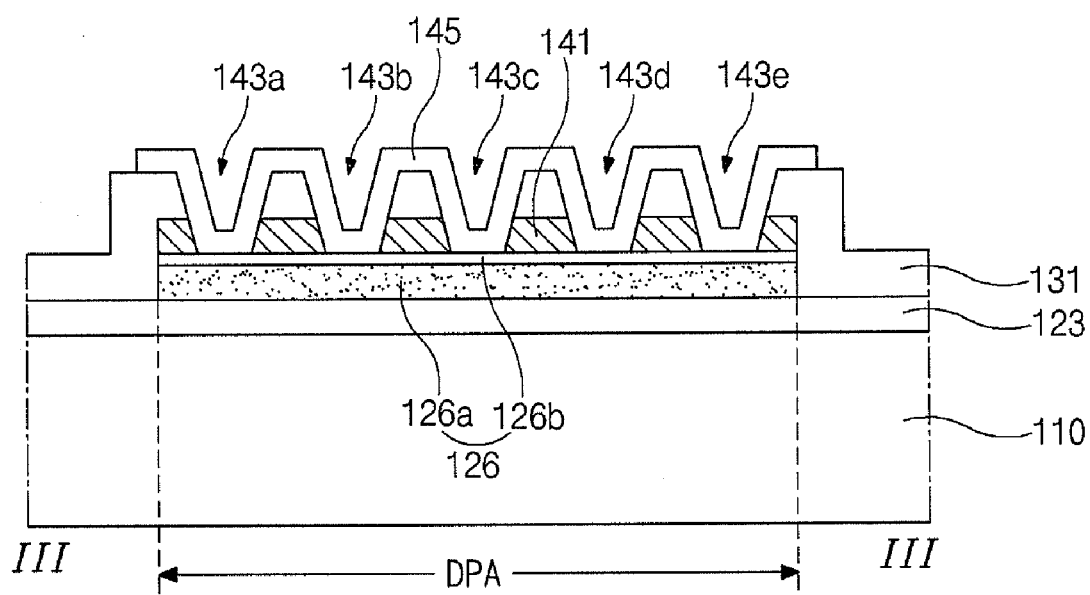
FIG. 7 is a cross-sectional view, taken along a line III-III of FIG. 6A.

FIG. 7 is a cross-sectional view, taken along a line III-III of FIG. 6A.

Referring to FIG. 7, in the data pad region DPA, a gate insulating layer 123 is on the substrate 100. The second semiconductor layer 126 and the data pad electrode 141 are sequentially formed on the gate insulating layer 123. A passivation layer 131 is formed on the data pad electrode 141. The passivation layer 131 and the data pad electrode 141 include a plurality of data pad contact holes 143a to 143e. The data pad electrode terminal 145 is formed on the passivation layer 131.

The data pad contact holes 143a to 143e expose inner side surfaces of the data pad electrode 141, and the data pad electrode terminal 145 contacts the inner side surfaces of the data pad electrode 141.

Figure 8:
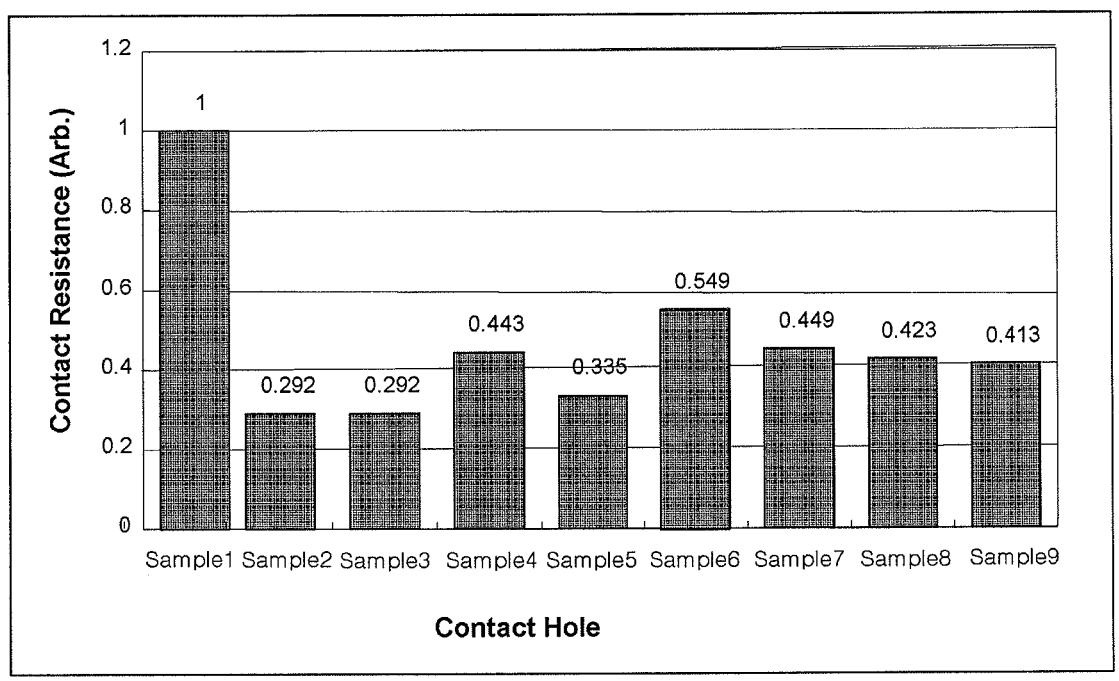
FIG. 8 is a graph illustrating experimental contact resistances of data pads of samples 1 to 9.

FIG. 8 is a graph illustrating experimental contact resistances of data pads of samples 1 to 9. In FIG. 8, the sample 1 indicates the data pad of the related art while the samples 2 to 9 indicate the data pads of FIGS. 4, 5A, 5B, 5C, 5D, 6A, 6B and 6C, respectively, according to the embodiment of the present invention.

Referring to FIG. 8, the contact resistances of the data pads of the embodiment are much less than that of the related art. In other words, since the circumference of the data pad contact hole of the embodiment is more than that of the related art, the contact area of the embodiment increases, and thus the contact resistance is reduced. Accordingly, signal delay is reduced, and the display quality can be improved.

In the embodiment as described above, the data pad is mainly explained. However, the gate pad may have structure similar to the structure of the data pad. For example, the gate pad may have various gate pad contact holes similar to the data pad contact holes of FIGS. 4 to 6C.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
    a gate line and a data line on a substrate crossing each other to define a pixel region;
    a thin film transistor in the pixel region and connected to the gate line and the data line;
    a pixel electrode in the pixel region and connected to the thin film transistor; and
    a gate pad at an end of the gate line and a data pad at an end of the data line, at least one of the gate pad and the data pad including:
        a pad electrode including at least one pad contact hole therein along with a passivation layer in a length direction of the data pad, the passivation layer on the pad electrode, the at least one pad contact hole having an asymmetric shape with respect to a vertical axis on the pad electrode; and
        a pad electrode terminal contacting inner side surfaces of the pad electrode surrounding the plurality of pad contact holes,
    wherein the asymmetric shape of the at least one pad contact hole is determined based on a contact area obtained using a circumference of the at least one pad contact hole and a thickness of the pad electrode in order to reduce a contact resistance.

2. The device according to claim 1, wherein the thin film transistor includes a first semiconductor layer, wherein the device further includes a second semiconductor layer extending from the first semiconductor layer and below the data line and the data pad electrode, and wherein a top surface of the second semiconductor layer is exposed through the at least one pad contact hole.

3. The device according to claim 2, wherein each of the first and second semiconductor layers includes an intrinsic amorphous silicon pattern and an impurity-doped amorphous silicon pattern on the intrinsic amorphous silicon pattern.

4. The device according to claim 1, wherein a side of the at least one pad contact hole has an uneven shape in plane, and an opposing side of each of the plurality of pad contact holes has a straight shape in plane and is located at a corresponding side of the pad electrode.

5. The device according to claim 1, wherein the at least one pad contact hole has a multiple-bent-path shape in plane.

6. The device according to claim 1, wherein the at least one pad contact hole has a "⊏" shape in plane.

7. The device according to claim 1, wherein the at least one pad contact hole has a "L" shape in plane.

8. A method of manufacturing a liquid crystal display device, comprising:
    forming a gate line and a data line on a substrate crossing each other to define a pixel region;
    forming a thin film transistor in the pixel region and connected to the gate line and the data line;
    forming a pixel electrode in the pixel region and connected to the thin film transistor; and
    forming a gate pad at an end of the gate line and a data pad at an end of the data line, forming at least one of the gate pad and the data pad including:
        forming a pad electrode including at least one pad contact hole therein along with a passivation layer, the passivation layer on the pad electrode, the at least one pad contact hole having an asymmetric shape with respect to a vertical axis on the pad electrode; and
        forming a pad electrode terminal contacting inner side surfaces of the pad electrode surrounding the plurality of pad contact holes,
    wherein the asymmetric shape of the at least one pad contact hole is determined based on a contact area obtained using a circumference of the at least one pad contact hole and thickness of the pad electrode in order to reduce a contact resistance.

* * * * *